US012085823B2

(12) United States Patent
Jinnai et al.

(10) Patent No.: US 12,085,823 B2
(45) Date of Patent: *Sep. 10, 2024

(54) DISPLAY DEVICE AND SEMICONDUCTOR DEVICE

(71) Applicant: Japan Display Inc., Tokyo (JP)

(72) Inventors: Toshihide Jinnai, Tokyo (JP); Hajime Watakabe, Tokyo (JP); Akihiro Hanada, Tokyo (JP); Ryo Onodera, Tokyo (JP); Isao Suzumura, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 10 days.

This patent is subject to a terminal disclaimer.

(21) Appl. No.: 17/987,887

(22) Filed: Nov. 16, 2022

(65) Prior Publication Data

US 2023/0074655 A1   Mar. 9, 2023

Related U.S. Application Data

(63) Continuation of application No. 17/506,694, filed on Oct. 21, 2021, now Pat. No. 11,550,195, which is a
(Continued)

(30) Foreign Application Priority Data

Feb. 19, 2019   (JP) .................................. 2019-027237

(51) Int. Cl.
*G02F 1/1362* (2006.01)
*G02F 1/1368* (2006.01)
(Continued)

(52) U.S. Cl.
CPC .. *G02F 1/136286* (2013.01); *G02F 1/136227* (2013.01); *G02F 1/1368* (2013.01);
(Continued)

(58) Field of Classification Search
CPC ......... G02F 1/136286; G02F 1/136227; G02F 1/136245

See application file for complete search history.

(56) References Cited

U.S. PATENT DOCUMENTS 11,550,195 B2 *   1/2023   Jinnai ............... H01L 29/78633
2010/0171131 A1 *   7/2010   Iki .......................... H01L 27/124
(Continued)

FOREIGN PATENT DOCUMENTS

CN          110137182 A      8/2019
JP        2010-176119 A      8/2010
(Continued)

OTHER PUBLICATIONS

Japanese Office Action issued Oct. 4, 2022, in Japanese Application No. 2019-027237.

*Primary Examiner* — Jessica M Merlin
(74) *Attorney, Agent, or Firm* — XSENSUS LLP (57) ABSTRACT

A display device including a substrate having a first TFT of an oxide semiconductor and a second TFT of a polysilicon semiconductor comprising: the oxide semiconductor 109 is covered by a first insulating film, a first drain electrode 110 is connected to the oxide semiconductor 109 via a first through hole 132 formed in the first insulating film, a first source electrode 111 is connected to the oxide semiconductor 109 via second through hole 133 formed in the first insulating film in the first TFT, a second insulating film is formed covering the first drain electrode 110 and the first source electrode 111, a drain wiring connects 12 to the first drain electrode 110 via a third through hole 130 formed in the second insulating film, a source wiring 122 is connected to the first source electrode 111 via a fourth through hole 131 formed in the second insulating film.

5 Claims, 10 Drawing Sheets

Related U.S. Application Data continuation of application No. 16/787,054, filed on Feb. 11, 2020, now Pat. No. 11,181,792.

(51) Int. Cl.
  *H01L 27/12* (2006.01)
  *H01L 29/786* (2006.01)
  *H10K 59/131* (2023.01)

(52) U.S. Cl.
  CPC ...... *H01L 27/124* (2013.01); *H01L 29/78672* (2013.01); *H10K 59/131* (2023.02); *G02F 2201/123* (2013.01)

(56) References Cited

U.S. PATENT DOCUMENTS

| | | |
|---|---|---|
| 2010/0182223 A1 | 7/2010 | Choi et al. |
| 2014/0131703 A1 | 5/2014 | Miyamoto et al. |
| 2017/0205925 A1* | 7/2017 | Yamazaki et al. .... G02F 1/1368 |
| 2017/0299929 A1* | 10/2017 | Ochiai .............. G02F 1/136227 |
| 2017/0338249 A1 | 11/2017 | Suzumura et al. |
| 2018/0083076 A1 | 3/2018 | Hanada |
| 2018/0122835 A1 | 5/2018 | Watakabe et al. |

FOREIGN PATENT DOCUMENTS

| | | |
|---|---|---|
| JP | 2016-093071 A | 5/2016 |
| JP | 2016-194703 A | 11/2016 |
| JP | 2017-208473 A | 11/2017 |
| JP | 2018-049919 A | 3/2018 |
| JP | 2018-074076 A | 5/2018 |
| JP | 2018-170325 A | 11/2018 |

* cited by examiner

DISPLAY DEVICE AND SEMICONDUCTOR DEVICE

CROSS-REFERENCE TO RELATED APPLICATIONS

The present application is a continuation of U.S. application Ser. No. 17/506,694, filed Oct. 21, 2021, which is a continuation of U.S. application Ser. No. 16/787,054, filed Feb. 11, 2020 (now U.S. Pat. No. 11,181,792), which claims priority from Japanese Patent Application JP 2019-027237 filed on Feb. 19, 2019, the entire contents of each are incorporated herein by its reference.

BACKGROUND OF THE INVENTION

(1) Field of the Invention

The present invention relates to a display device and a semiconductor device having a so cold hybrid structure, which uses TFTs of polysilicon semiconductor and TFTs of oxide semiconductor.

(2) Description of the Related Art

A liquid crystal display device has a TFT substrate, a counter substrate opposing to the TFT substrate, and a liquid crystal layer sandwiched between the TFT substrate and the counter substrate. The TFT substrate has plural pixels arranged in matrix; each of the pixels has a pixel electrode and a thin film transistor (TFT). A transmittance of light in each of the pixels is controlled by liquid crystal molecules; thus, images are formed. On the other hand, the organic EL display device has plural pixels arranged in matrix on the TFT substrate; each of the pixels has an emitting element and a driving TFT. Since the organic EL display device does not need a backlight, it is more profitable for a thinner display.

Since polysilicon semiconductor has higher mobility, it is suitable for a driving circuit TFT. On the other hand, since oxide semiconductor has a high OFF resistance, lower OFF current can be realized when it is used for a switching TFT in the pixel.

Patent document 1, Patent document 2, Patent document 3, Patent document 4, and Patent document 5 describe a display device that uses both polysilicon semiconductor TFTs and oxide semiconductor TFTs.

LIST OF PATENT DOCUMENTS

Patent document 1: Japanese patent application laid open 2018-74076
Patent document 2: Japanese patent application laid open 2017-208473
Patent document 3: Japanese patent application laid open 2018-49919
Patent document 4: Japanese patent application laid open 2016-93071
Patent document 5: Japanese patent application laid open 2016-194703

SUMMARY OF THE INVENTION

A switching TFT used in the pixel needs to have low leak current. The TFT of oxide semiconductor (herein after, oxide semiconductor TFT) has low leak current. The oxide semiconductor, however, has low carrier mobility, thus sometimes it may be difficult to form the driving circuit installed in the display device by the oxide semiconductor TFTs.

On the other hand, the TFTs of polysilicon semiconductor (herein after polysilicon semiconductor TFT) has higher mobility, thus, the driving circuit can be formed by the polysilicon semiconductor TFTs. However, the polysilicon semiconductor TFT has higher leak current, thus, two polysilicon semiconductor TFTs arranged in series are used when it is used as a switching TFT in the pixel.

Consequently, it is reasonable to use the oxide semiconductor TFT as a switching TFT in the pixel in the display area, and to use a polysilicon semiconductor TFT in the driving circuit in the peripheral area. The polysilicon semiconductor TFT and the oxide semiconductor TFT are formed on different layers. According to process temperature requirement, the polysilicon semiconductor TFT is formed at first, in other words, on the lower layers; then the oxide semiconductor TFT is formed, in other words, on the upper layers.

By the way, since the polysilicon semiconductor is oxidized during the process, the through hole formed in the insulating layer on the polysilicon semiconductor must be cleansed to eliminate oxide on the polysilicon semiconductor using the hydrofluoric acid. In this cleansing process, however, the hydrofluoric acid penetrates into the through holes formed in the oxide semiconductor TFT area. The problem is that the oxide semiconductor is washed away by the hydrofluoric acid.

To countermeasure this problem, the drain metal and the source metal are formed on the oxide semiconductor; then, the through hole is not formed directly on the oxide semiconductor, but is formed on the drain metal or the source metal. This kind of structure is disclosed in the patent documents 1-5.

The patent documents 1-4 show an example that the drain metal and the source metal are formed on the oxide semiconductor. This structure, however, has a problem that the surface of the oxide semiconductor is contaminated when the drain metal and the source metal are formed; thus, characteristics of the oxide semiconductor TFT become unstable. The patent document 5 shows an example that the oxide semiconductor TFT is formed on the drain metal and the source metal. However, even in this case, since the drain metal and the source metal are patterned before the oxide semiconductor is formed, there is a risk that the bottom surface of the oxide semiconductor is contaminated. In addition, there is a risk of step disconnection of the oxide semiconductor film since the thin oxide semiconductor film is formed on the drain metal and the source metal.

The present invention overcomes the above explained problem and realizes the oxide semiconductor TFT having stable characteristics. The present invention realizes a display device or a semiconductor device of high reliability, which uses both the oxide semiconductor TFT and the polysilicon semiconductor TFT.

An example of concrete structure of the present invention is as follows.

A display device including a substrate having a first TFT (thin film transistor) of an oxide semiconductor and a second TFT of a polysilicon semiconductor comprising:
the oxide semiconductor is covered by a first insulating film, a first drain electrode is connected to the oxide semiconductor via a first through hole formed in the first insulating film, a first source electrode is connected to the oxide semiconductor via second through hole formed in the first insulating film in the first TFT, a second insulating film is formed covering the first drain electrode and the first source electrode, a drain wiring connects to the first drain electrode via a third through hole formed in the second insulating film, a source wiring is connected to the source electrode via a fourth through hole formed in the second insulating film.

DETAILED DESCRIPTION OF THE PREFERRED EMBODIMENTS

Examples of the oxide semiconductor are e.g. IGZO (Indium Gallium Zinc Oxide), ITZO (Indium Tin Zinc Oxide), ZnON (Zinc Oxide Nitride), and IGO (Indium Gallium Oxide). The present invention is explained when IGZO is used as the oxide semiconductor.

In the display device, LTPS (Low Temperature Polysilicon Semiconductor) is generally used. The LTPS is transformed from a-Si semiconductor, which is formed by CVD (Chemical Vapor Deposition), by annealing with excimer laser.

In this specification, the structure that uses both the oxide semiconductor TFT and the polysilicon semiconductor TFT may be called as the hybrid structure. Herein below, the present invention is concretely explained by the following embodiments.

Embodiment 1

Figure 1:
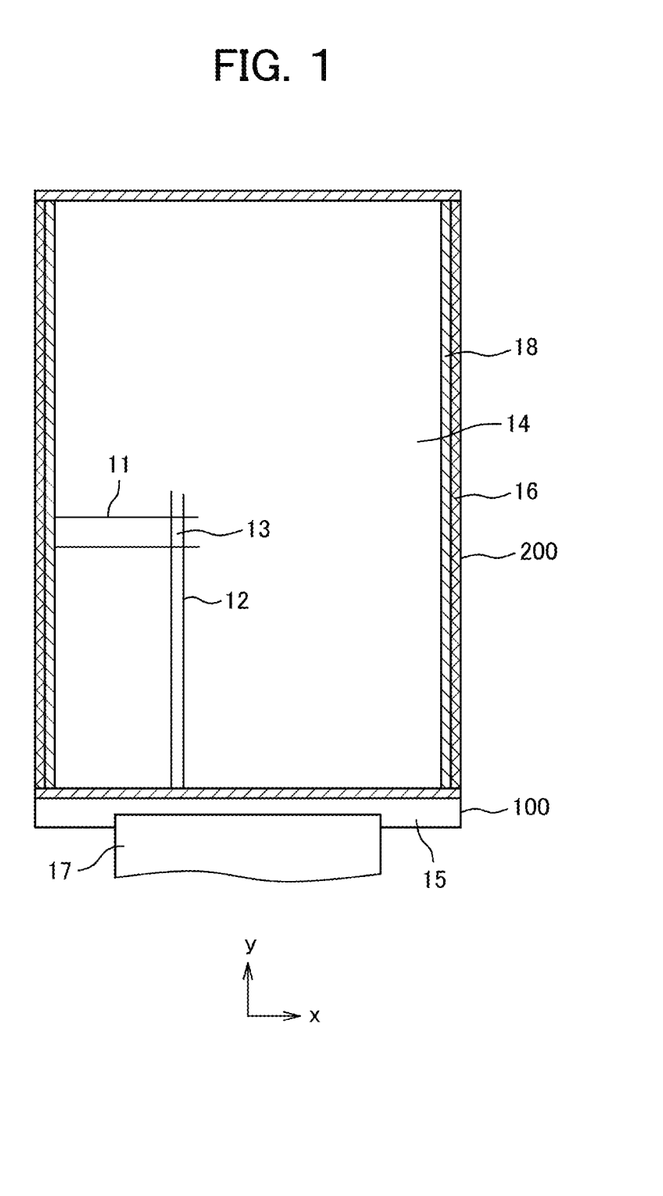
FIG. 1 is a plan view of the liquid crystal display device.

FIG. 1 is a plan view of the liquid crystal display device, which the present invention is being applied. In FIG. 1, the TFT substrate 100 and the counter substrate 200 are adhered by the sealing material 16; the liquid crystal layer is sandwiched by the TFT substrate 100 and the counter substrate 200. The display area 14 is formed in the area the counter substrate 200 and the TFT substrate 100 overlap.

In the display area 14 of the TFT substrate 100, the scan signal wirings 11 extend in the horizontal direction (x direction) and are arranged in the vertical direction (y direction). The video signal wirings 12 extend in the vertical direction and are arranged in the horizontal direction. The pixel is defined by the area surrounded by the scan signal wirings 11 and the video signal wirings 12.

The TFT substrate 100 is formed bigger than the counter substrate 200; The TFT substrate 100 that does not overlap with the counter substrate 200 forms a terminal area 15. The flexible wiring substrate 17 is connected to the terminal area 15. The driver IC that drives the liquid crystal display device is installed in the flexible wiring substrate 17.

Since the liquid crystal does not emit light by itself, a backlight is set in the rear side of the TFT substrate 100. Each of the pixels of the liquid crystal panel controls a transmittance of the light from the backlight; thus, an image is formed. The flexible wiring substrate 17 is folded back to the rear surface of the backlight; thus, the outer size of the whole of the liquid crystal display device is made compact.

In the liquid crystal display device of the present embodiment, the TFT in the display area 14 is formed by the oxide semiconductor TFT, which has lower leak current. The scan signal wiring diving circuit 18 is formed at the frame area near the sealing material; the polysilicon semiconductor TFTs, which have higher carrier mobility, are used in the scan signal wiring driving circuit 18.

Figure 2:
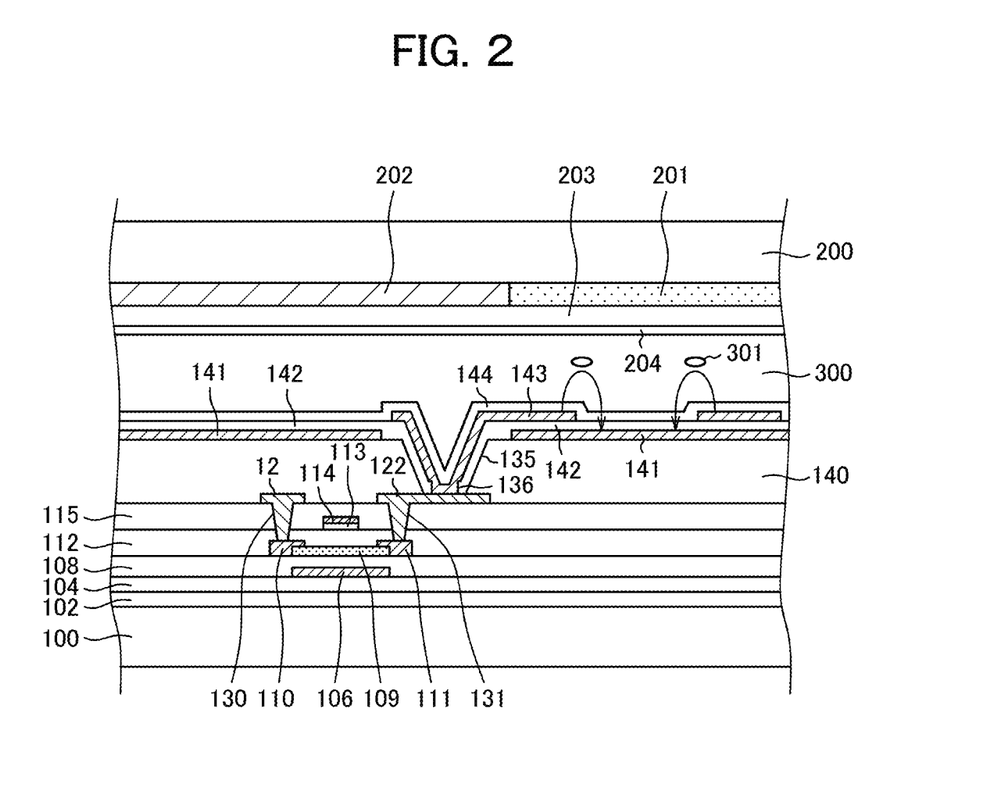
FIG. 2 is a cross sectional view of the display area of the liquid crystal display device.

FIG. 2 is a cross sectional view of the display area, where pixels exist. The structure of FIG. 2 is so called FFS (Fringe Field Switching) mode liquid crystal display device, which is one species of the IPS (In Plane Switching) mode liquid crystal display device. The TFT in FIG. 2 uses the oxide semiconductor 109. Since the TFT of the oxide semiconductor 109 has lower leak current, it is suitable as a switching TFT.

In this invention, as explained later, the peripheral driving circuit is formed by the polysilicon semiconductor TFTs; consequently, insulating layers for the polysilicon TFTs are formed in the display area, too. The polysilicon semiconductor TFT is formed nearer to the TFT substrate 100 than the oxide semiconductor TFT is to the TFT substrate 100; the gate insulating film 104 of the polysilicon semiconductor TFT extends to the display area 14.

In FIG. 2, the undercoat film 102 is formed on the TFT substrate 100, which is made of glass or resin, e.g. polyimide. The undercoat film 102 works as a barrier against the impurities from the glass or resin substrate; thus, the polysilicon semiconductor film or oxide semiconductor film is protected from being contaminated by impurities. In many cases, the undercoat film 102 is a laminated film of the silicon oxide film and the silicon nitride film. Sometimes, the aluminum oxide film is added for the undercoat film 102.

The gate insulating film 104, which is used for the polysilicon semiconductor TFT, is formed on the undercoat film 102. The light shading film 106 of metal is formed on the gate insulating film 104. The metal can be formed by the same material as the gate electrode. The light shading film 106 stops light from the backlight for the channel of the TFT, which is formed later.

The light shading film 106 can work as a shield electrode if a certain voltage is applied on it. When the TFT substrate 100 is made of resin, like polyimide, the substrate 100 is easily charge up, which influences the characteristics of the TFT. If the light shading film 106 is used as a shield electrode, the influence of charge up of the TFT substrate 100 to the TFT can be prevented.

The interlayer insulating film 108 is formed covering the light shading film 106. The interlayer insulating film 108 is formed by the silicon oxide film or the laminated film of the silicon oxide film and the silicon nitride film. The oxide semiconductor film 109, which constitutes the TFT, is formed on the interlayer insulating film 108. A thickness of the oxide semiconductor film 109 is 10 to 100 nm. The drain electrode 110 and the source electrode 111 are formed at the drain area and the source area of the oxide semiconductor film 109, where the through holes 130 and 131 are formed. The drain electrode 110 and the source electrode 111 protect the oxide semiconductor 109 from being dissolved by the hydrofluoric acid, which penetrates the through holes 130 and 131 in the cleansing process of the polysilicon semiconductor TFT. In the actual products, as shown in the FIG. 2 and FIG. 3, the drain electrode 110 and the source electrode 111 extend on the interlayer insulating film 108.

The second gate insulating film 112 is formed by silicon oxide covering the oxide semiconductor film 109. The second gate insulating film 112, formed by silicon oxide, supplies oxygen to the oxide semiconductor film 109 to stabilize the characteristics of the channel. The second gate electrode 114 is formed over the second gate insulating film 112; the aluminum oxide film 113 is formed in a thickness of e.g. 10 nm between the second gate electrode 114 and the second gate insulating film 112 to assist supplying oxygen to the oxide semiconductor film 109 from the second gate insulating film 112.

The inorganic passivation film 115 is formed by silicon oxide or silicon nitride covering the second gate electrode 114. A thickness of the inorganic passivation film 115 is e.g. 150 to 300 nm. The inorganic passivation film 115 can be a laminated film of the silicon oxide film and the silicon nitride film.

The through holes 130 and 131 are formed through the inorganic passivation film 115 and the second gate insulating film 112. The through hole 130 connects the oxide semiconductor film 109 and the video signal wiring 12 (which is the drain wiring in FIG. 2); the through hole 131 connects the oxide semiconductor film 109 and the source wiring 122. The source wiring 122 connects with the pixel electrode 143 via through holes 135 and 136.

In FIG. 2, the organic passivation film 140 is formed covering the video signal wiring 12 and the source wiring 122. The organic passivation film 140 is made of e.g. acrylic resin. The organic passivation film 140 is made thick as 2 to 4 micron so that it can work as a flattening film and it can decrease a floating capacity between the video signal wiring 12 and the common electrode 141. The through hole 135 is formed in the organic passivation film 140 to connect the source wiring 122 and the pixel electrode 143.

Figure 3:
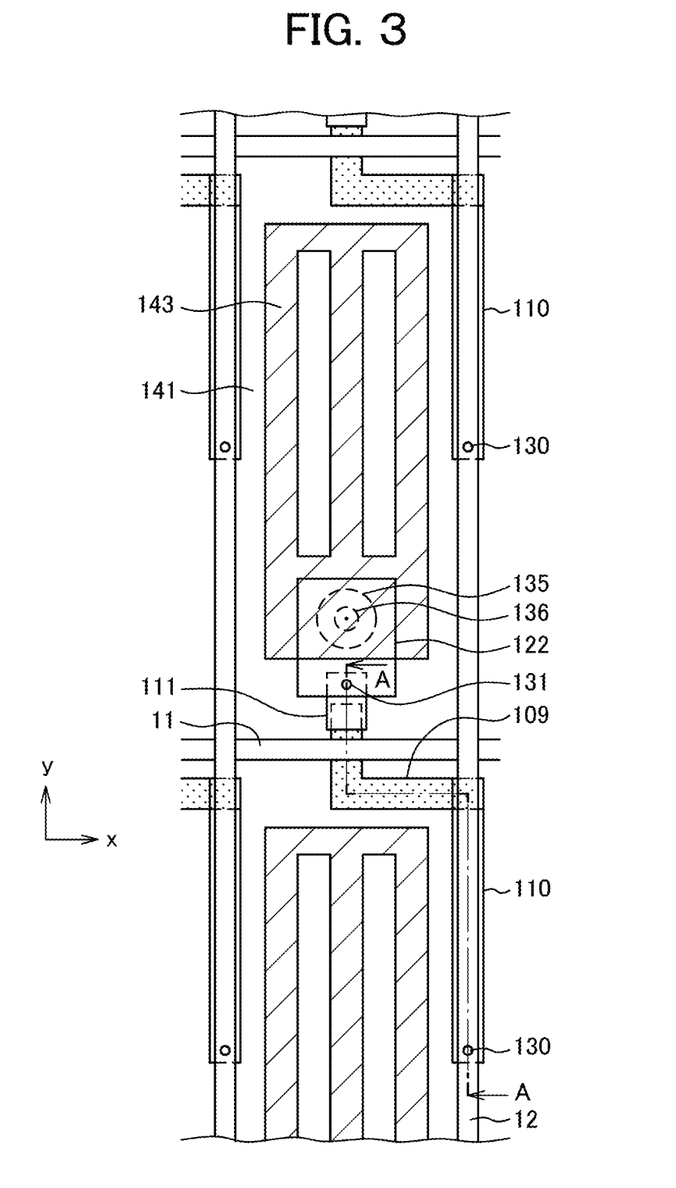
FIG. 3 is a plan view of the pixel in the display area of the liquid crystal display device when the present invention is not applied.

The common electrode 141 is formed by transparent conductive film made of e.g. ITO (Indium Tin Oxide) on the organic passivation film 140. The common electrode 141 is made in planar shape in common to plural pixels. The capacitor insulating film 142 is formed by silicon nitride covering the common electrode 141. The pixel electrode 143 is formed by transparent conductive film made of e.g. ITO covering the capacitor insulating film 142. The pixel electrode 143 is made comb shaped. An example of a plan view of the pixel electrode 143 is shown in FIG. 3. The capacitor insulating film 142 forms capacitance between the common electrode 141 and the pixel electrode 143.

The alignment film 144 is formed covering the pixel electrode 143. The alignment film 144 controls an initial alignment direction of liquid crystal molecules 301. A rubbing process or an optical alignment process, which uses polarized ultra violet light, is used as an alignment treatment of the alignment film 144. Since the IPS mode liquid crystal display device does not need pre-tilt angle, the optical alignment is advantageous for the IPS mode.

In FIG. 2, the counter substrate 200 opposes to the TFT substrate sandwiching the liquid crystal layer 300. The color filter 201 and the black matrix 202 are formed on the counter substrate 200; the over coat film 203 is formed on the color filter 201 and the black matrix 202. The alignment film 204 is formed on the over coat film 203. The function of the alignment film 204 and the alignment treatment of the alignment film 204 are the same as those of the alignment film 144 on the TFT substrate 100.

In FIG. 2, a line of force is generated as shown as an arrow in FIG. 2 when a voltage is applied between the common electrode 141 and the pixel electrode 143; consequently, the liquid crystal molecules 301 are rotated to control transmittance of light in each of the pixel, thus, images are formed.

FIG. 3 is a plan view of a pixel in the display area of the liquid crystal display device corresponding to FIG. 2. In FIG. 3, the scan signal wirings 11 extend in the horizontal direction (x direction) and are arranged in the vertical direction (y direction); the video signal wirings 12 extend in the vertical direction and are arranged in the horizontal direction. The pixel electrode 143 is formed in an area surrounded by the scan signal wirings 11 and the video signal wirings 12. The oxide semiconductor TFT is formed between the video signal wiring 12 and the pixel electrode 143 in a plan view. The light shading film is neglected in FIG. 3.

In FIG. 3, the drain electrode 110 connects with the video signal wiring 12 via through hole 130, extends underneath the video signal wiring 12, and connects with the oxide semiconductor 109 by superposing on one terminal of the oxide semiconductor 109. The oxide semiconductor 109 extends and bends like L shape, and goes through under the scan signal wiring 11 to form the TFT for the above located adjacent pixel.

The channel of the TFT is formed when the oxide semiconductor film 109 goes through under the scan signal wiring 11. In FIG. 3, the scan signal wiring 11 works as the gate electrode 114 in FIG. 2. The oxide semiconductor film 109 gets conductivity except the gate electrode 114, in other words, the channel under the scan signal wiring 11 by being doped with Phosphorus (P) or Boron (B) through ion implantation. Another terminal of the oxide semiconductor film 109 superposes the source electrode 111 for connection. The source electrode 111 extends to the direction of the pixel electrode 143, and connects with the source wiring 122 via through hole 131.

The source wiring 122 connects with the pixel electrode 143 via the through hole 135 formed in the organic passivation film 140 and the through hole 136 formed in the capacitor insulating film 142. The pixel electrode 143 is formed as comb shaped; the common electrode 141 is formed under the pixel electrode 143 in a planar shape. As explained in FIG. 2, a line of force is generated when a voltage is applied between the common electrode 141 and the pixel electrode 143; consequently, the liquid crystal molecules 301 are rotated to control transmittance of light in each of the pixels.

As explained above, the drain area of the oxide semiconductor film 109 connects with the video signal wiring 12 through drain electrode 110 via the through hole 130; the source area of the oxide semiconductor film 109 connects with the source wiring 122 through the source electrode 111 via through hole 131. Therefore, even if the hydrofluoric acid penetrates into the through holes 130 and 131, the hydrofluoric acid does not contact the oxide semiconductor film 109; thus, the oxide semiconductor film 109 is not dissolved.

Figure 4:
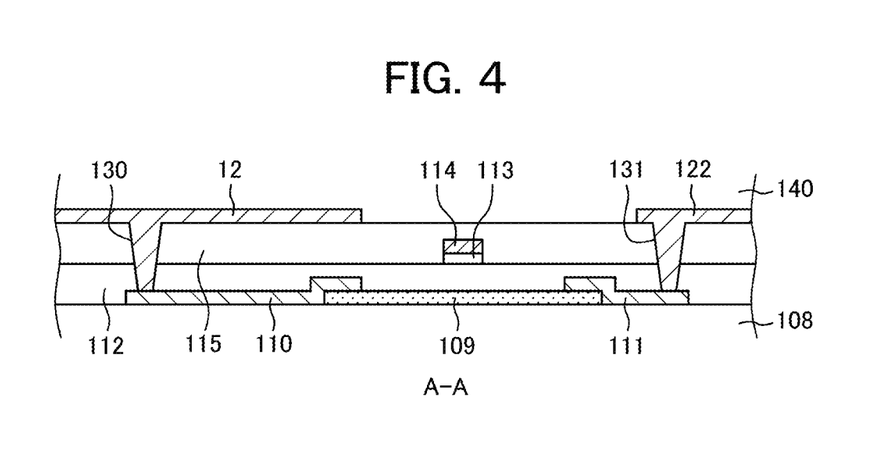
FIG. 4 is a cross sectional view of FIG. 3 along the line A-A.

This structure, however, has the following problems. FIG. 4 is a cross sectional view of FIG. 3 along the line A-A. In FIG. 4, the oxide semiconductor film 109 is formed on the interlayer insulating film 108. The drain electrode 110 superposes the oxide semiconductor film 109 at the drain area; the source electrode 111 superposes the oxide semiconductor film 109 at the source area. The second gate insulating film 112 is formed covering the oxide semiconductor film 109, the drain electrode 110 and source electrode 111.

The second gate electrode 114 is formed over the second gate insulating film 112 via the aluminum oxide film 113; the inorganic passivation film 115 is formed covering the second gate electrode 114. The video signal wiring 12 extends on the inorganic passivation film 115 at one side of the oxide semiconductor film 109; the source wiring 122 extends on the inorganic passivation film 115 at another side of the oxide semiconductor film 109. The video signal wiring 12 and the drain electrode 110 connect via through hole 130; source wiring 122 and the source electrode 111 connect via through hole 131.

In FIG. 4, the oxide semiconductor film 109 is formed on the interlayer insulating film 108 by e.g. sputtering; then the oxide semiconductor film 109 is patterned. Subsequently, the metal, e.g. Ti, which is to be the drain electrode 110 and the source electrode 111, is formed by e.g. sputtering. In this process, Ti is sputtered on the channel of the oxide semiconductor film 109; thus, the channel of the oxide semiconductor film 109 is contaminated.

After that, Ti film is patterned. The Ti film is patterned through chlorine dry etching; during the dry etching, the oxide semiconductor film 109 also gets damaged. For example, the surface of the oxide semiconductor film 109 tends to be roughened since the oxide semiconductor film 109 is etched by chlorine dry etching.

Such damage to the oxide semiconductor film 109 makes fluctuation in the characteristics of the oxide semiconductor TFT. Concretely, the fluctuation appears as the fluctuation in threshold voltage Vt. Such problem is the same when MoW is used for the drain electrode 110 and the source electrode 111.

Figure 5:
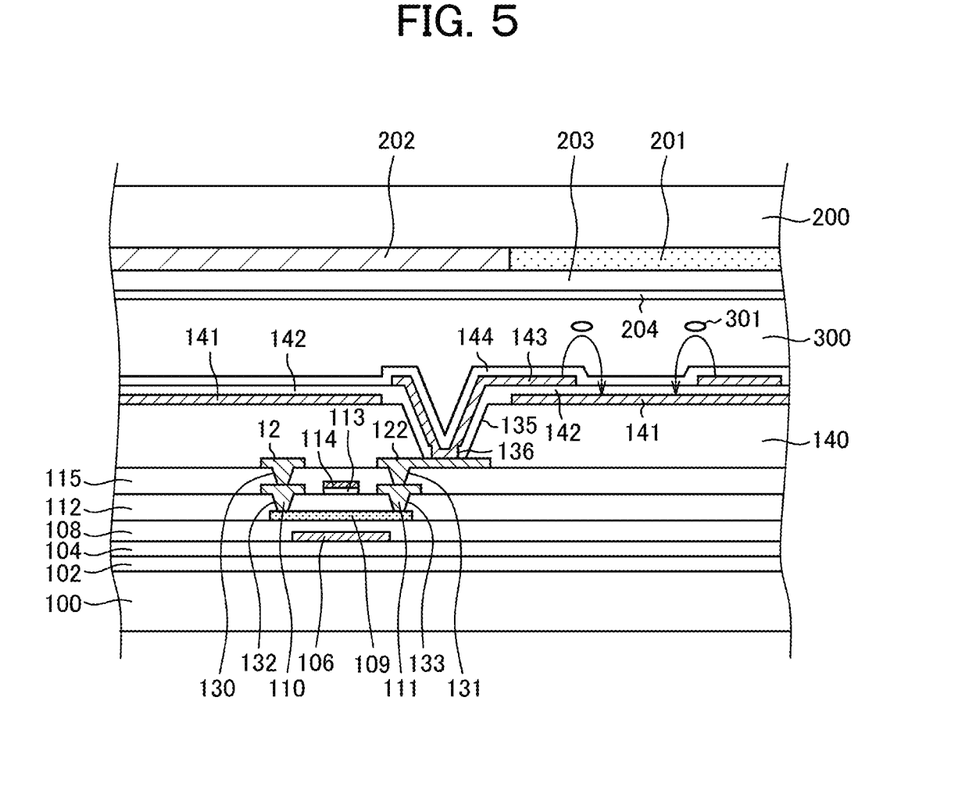
FIG. 5 is a cross sectional view of the pixel in the display area of the liquid crystal display device according to the present invention.

The present invention can suppress the fluctuation in characteristics of the oxide semiconductor film 109, and thus, realize the oxide semiconductor TFT having stable characteristics. FIG. 5 is a cross sectional view according to the present embodiment. FIG. 5 is a cross sectional view of the display area of the liquid crystal display device according to the present embodiment. FIG. 5 differs from FIG. 2 in the structure of the oxide semiconductor TFT portion; other structure of FIG. 5 is the same as FIG. 2, therefore, only the structure of the oxide semiconductor TFT portion is explained.

In FIG. 5, the oxide semiconductor film 109 is formed on the interlayer insulating film 108, and is patterned. The second gate insulating film 112 is formed covering the oxide semiconductor film 109. The through hole 132 is formed in the second gate insulating film 112 at the drain area of the oxide semiconductor film 109; the through hole 133 is formed in the second gate insulating film 112 at the source area of the oxide semiconductor film 109. The drain electrode 110 is formed in the through hole 132 and the source electrode 111 is formed in the through hole 133. The second gate electrode 114 is formed above the second gate insulating film 112 sandwiching the aluminum oxide film 113. Therefore, all the electrodes, namely, the drain electrode 110, the source electrode 111, and the second gate electrode 114 are formed on the second gate insulating film 112. The drain electrode 110, the source electrode 111, and the second gate electrode 114 can be formed by the same material. The inorganic passivation film 115 is formed covering those electrodes.

The through hole 130 is formed in the inorganic passivation film 115 to connect the drain electrode 110 and the video signal wiring 12, which works as the drain wiring; the through hole 131 is formed in the inorganic passivation film 115 to connect the source electrode 111 and the source wiring 122.

The drain electrode 110 connects with the oxide semiconductor film 109 via the through hole 132 in the second gate insulating film 112; the source electrode 111 connects with the oxide semiconductor film 109 via the through hole 133 in the second gate insulating film 112. A big difference between FIG. 5 and FIG. 2 is that the drain electrode 110 and the source electrode 111 are not formed on the same layer as the oxide semiconductor film 109, but are connected with the oxide semiconductor film 109 via through hole 132 and the through hole 133.

Figure 6:
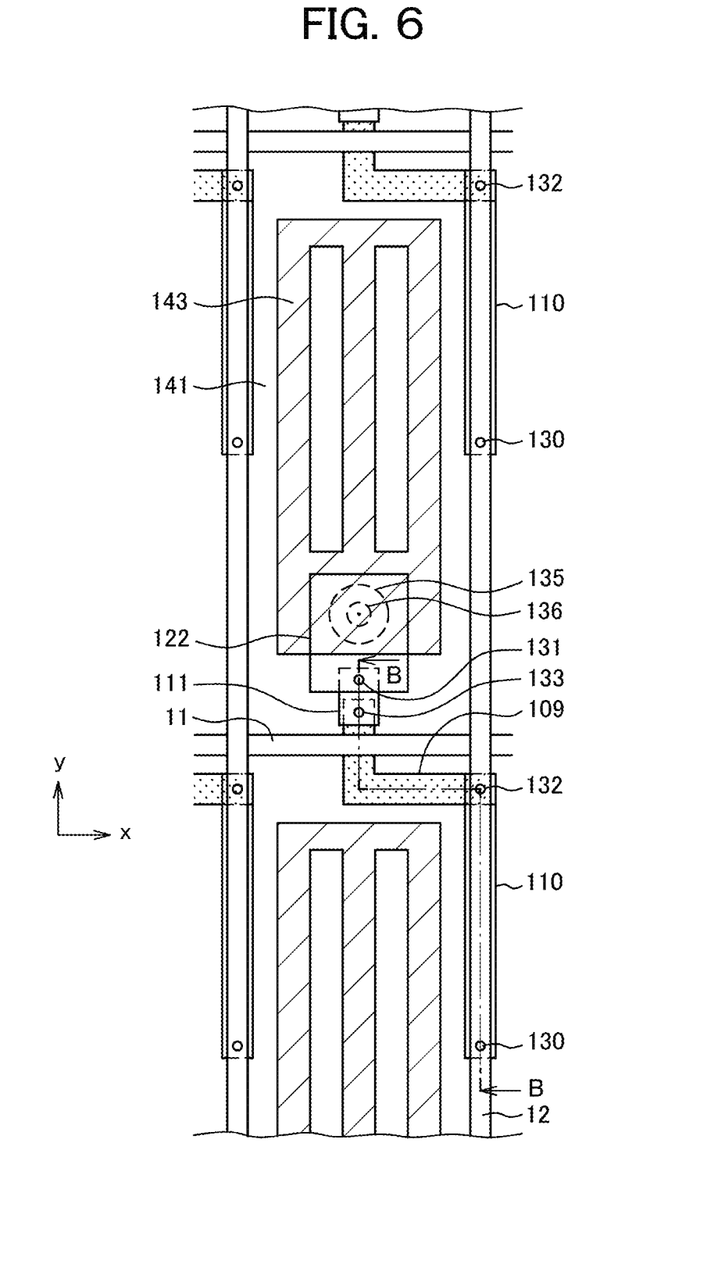
FIG. 6 is a plan view of the pixel in the display area of the liquid crystal display device according to the present invention.

FIG. 6 is a plan view of a pixel in the display area of the liquid crystal display device corresponding to FIG. 5. FIG. 6 differs from FIG. 3 in that: the drain electrode 110 and the oxide semiconductor film 109 are connected via through hole 132, and the source electrode 111 and the source wiring 122 are connected via through hole 133. Other structure of FIG. 6 is the same as FIG. 3.

Figure 7:
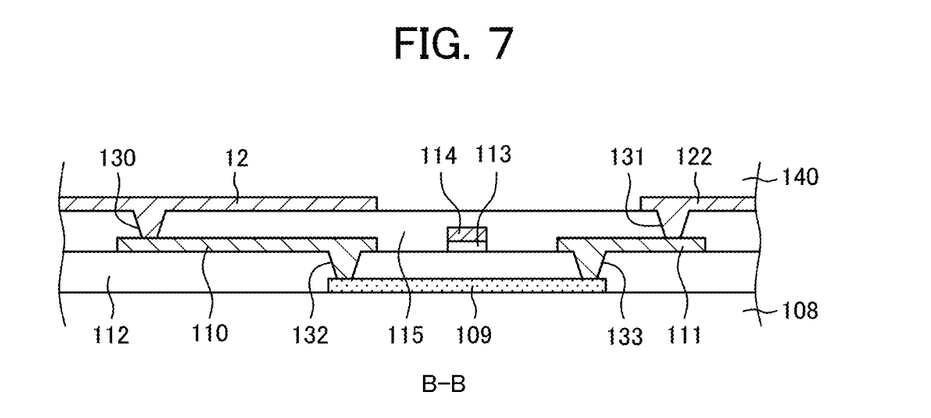
FIG. 7 is a cross sectional view of FIG. 6 along the line B-B.

FIG. 7 is a cross sectional view of FIG. 6 along the line B-B. FIG. 7 differs from FIG. 4 in that: the drain electrode 110 is formed on the second gate insulating film 112, which is a different layer from the layer that the oxide semiconductor film 109 is formed, and is connected to the oxide semiconductor film 109 via through hole 132; the source electrode 111 is formed on the second gate insulating film 112, which is a different layer from the layer that the oxide semiconductor film 109 is formed, and is connected to the oxide semiconductor film 109 via through hole 133.

The drain electrode 110 and the source electrode 111 do not superpose with the oxide semiconductor film 109 in the structure of FIG. 7. Therefore, damage to the oxide semiconductor film 109 when the drain electrode 110 and the source electrode 111 are formed and damage to the oxide semiconductor film 109 when the drain electrode 110 and the source electrode 111 are patterned is avoided.

In FIG. 7, the through hole 132, which connects the drain electrode 110 and the oxide semiconductor film 109, and the through hole 133, which connects the source electrode 111 and the oxide semiconductor film 109, are not exposed to the hydrofluoric acid when through holes in the polysilicon semiconductor TFT are cleansed; consequently, the oxide semiconductor film 109 is not dissolved by the hydrofluoric acid. As described above, since forming of the drain electrode 110 and the source electrode 111 does not damage the oxide semiconductor film 109, the oxide semiconductor TFT of stable characteristics can be realized.

Figure 8:
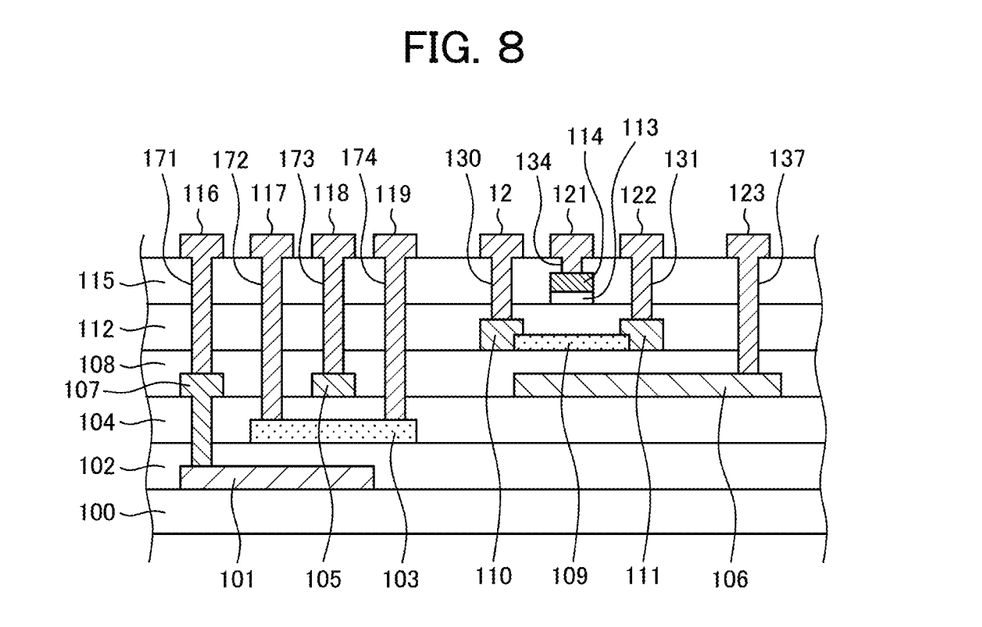
FIG. 8 is a cross sectional view of hybrid structure of the polysilicon semiconductor TFT and the oxide semiconductor.
Figure 9:
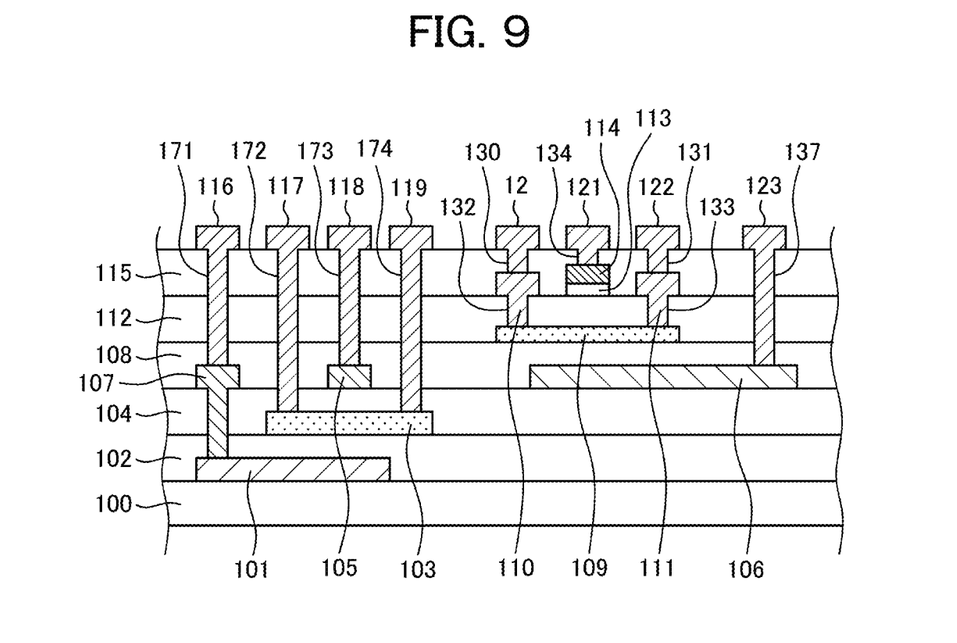
FIG. 9 is a cross sectional view of hybrid structure of the polysilicon semiconductor TFT and the oxide semiconductor TFT according to an example of the present invention.

FIG. 8 and FIG. 9 are cross sectional views the oxide semiconductor TFT and the polysilicon semiconductor TFT are formed on the same substrate 100 (hybrid structure). In the actual products, the oxide semiconductor TFT is formed in the display area and the polysilicon semiconductor TFT is formed in the peripheral circuit area, thus, they are apart each other; however, the oxide semiconductor TFT and the polysilicon semiconductor TFT are shown side by side in FIGS. 8 and 9 for easy perception of the drawings.

FIG. 8 shows a hybrid structure when the present invention is not applied to the oxide semiconductor TFT; FIG. 9 shows a hybrid structure when the present invention is applied to the oxide semiconductor TFT. In both cases, the polysilicon semiconductor TFT is formed prior to the oxide semiconductor TFT is formed, in other words, the polysilicon semiconductor TFT is formed nearer to the substrate 100. The reason is that the process for the polysilicon semiconductor film 103 needs higher temperature process than the process for the oxide semiconductor film 109.

FIG. 8 is explained at the outset. In FIG. 8, the first light shading film 101 is formed on the TFT substrate 100, which is made of ether glass or resin like e.g. polyimide. The first light shading film 101 can be formed by the same material as the gate electrode, e.g. MoW or a laminated film of Ti—Al—Ti. The first light shading film 101 shields the light from the backlight to suppress the photo current in the polysilicon semiconductor film 103 formed above the first light shading film 101.

Another important role of the first light shading film 101 is to shield the polysilicon semiconductor 103 from the charges accumulated in the TFT substrate 100. Specifically, the TFT substrate 100 made of resin, e.g. polyimide, is easily charge up; therefore, a shield by the first light shading film 101 is necessary. For the purpose of shielding, a predetermined voltage, like e.g. common voltage is applied to the first light shading film 101.

The undercoat film 102 is formed over the first light shading film 101 by e.g. CVD. The undercoat film 102 is e.g. a laminated film of the silicon oxide film and the silicon nitride film. The polysilicon semiconductor film 103 is formed on the undercoat film 102. The polysilicon semiconductor film 103 is formed as: the a-Si film is formed by e.g. CVD at the outset; then the a-Si film is transformed to the polysilicon film 103 by excimer laser. After that, the polysilicon semiconductor film 103 is patterned.

The first gate insulating film 104 is formed by e.g. the silicon nitride film covering the polysilicon semiconductor film 103. The first gate electrode 105 is formed on the first gate insulating film 104. The material for the first gate electrode 114 is e.g. MoW or a laminated film of Ti—Al—Ti. The second light shading film 106 for the oxide semiconductor film 109 is formed simultaneously with the first gate electrode 105. Namely, the first gate electrode 105 and the second light shading film 106 are made of the same material. The structure and the role of the second light shading film 106 are the same as explained in FIG. 2.

The interlayer insulating film 108 is formed covering the first gate electrode 105 and the second light shading film 106. The interlayer insulating film 108 is e.g. a laminated film of the silicon nitride film as a lower layer and the silicon oxide film as an upper layer. In this case, hydrogen is supplied from the silicon nitride film to the polysilicon semiconductor film 103 and oxygen is supplied from the silicon oxide film to the oxide semiconductor film 109.

The oxide semiconductor film 109 is formed on the interlayer insulating film 108; the drain electrode 110 is superposed at one side of the oxide semiconductor film 109 and the source electrode 111 is superposed at another side of the oxide semiconductor film 109. Formation of the oxide semiconductor film 109, the drain electrode 110 and the source electrode 111 are the same as explained at FIGS. 2 through 4. The second gate insulating film 112 is formed covering the oxide semiconductor film 109, the drain electrode 110 and the source electrode 111; the second gate electrode 114 is formed over the second gate insulating film 112 via the aluminum oxide film 113. The inorganic passivation film 115 is formed covering the second gate electrode 114. Formation and role of the oxide semiconductor film 109 through the inorganic passivation film 115 are the same as explained at FIG. 2.

After that, the through holes 171, 172, 173, 174, 130, 131, 134, and 137 are formed in the inorganic passivation film 115, the second gate insulating film 112 and the interlayer insulating film 108; subsequently, the first shield wiring 116, the first drain electrode 117, the first gate wiring 118, the first source electrode 119, the second drain wiring 12, the second gate wiring 121, the second source wiring 122, and second shield wiring 123 are formed in each of the through holes.

Hydrofluoric acid (HF) is used to eliminate the oxide at the surface of the polysilicon semiconductor 103 in the through holes 172 and 174; however, the hydrofluoric acid (HF) penetrates in other through holes. In the structure of FIG. 8, however, the hydrofluoric acid (HF) contacts only the drain electrode 110 and the source electrode 111, but does not contact the oxide semiconductor film 109 in the through holes 130 and 131; thus, the oxide semiconductor film 109 is not dissolved in the hydrofluoric acid (HF).

In the structure of FIG. 8, however, the oxide semiconductor film 109 is contaminated when the drain electrode 110 and the source electrode 111 are formed at the sides of the oxide semiconductor 109. Namely, the oxide semiconductor 109 is contaminated when the metal for the drain electrode 110 and the source electrode 111 is sputtered and when the drain electrode 110 and the source electrode 111 are patterned. Consequently, characteristics of the oxide semiconductor TFT become unstable.

FIG. 9 is a cross sectional view of the hybrid structure according to the present embodiment that the above problem is solved. In FIG. 9, the structures up to formation of the oxide semiconductor film 109 are the same as FIG. 8. FIG. 9 differs from FIG. 8 in that the second gate insulating film 112 is formed after the oxide semiconductor film 109 is patterned. Therefore, the oxide semiconductor film 109 is not contaminated in the process of forming the metal for the drain electrode 110 and the source electrode 111 and patterning of the metal.

In FIG. 9, the through hole 132 and the through hole 133 are formed in the second gate insulating film 112 for the drain electrode 110 and the source electrode 111. After that, the drain electrode 110, the second gate electrode 114 and the source electrode 111 are formed on the second gate insulating film 112.

After that, the inorganic passivation film 115 is formed covering the drain electrode 110, the second gate electrode 114 and the source electrode 111. Subsequently, the through holes 171, 172, 173, 174, 130, 131, 134, and 137 are formed in the inorganic passivation film 115, the second gate insulating film 112, the interlayer insulating film 108, and the first gate insulating film 104; then the first shield wiring 116, the first drain electrode 117, the first gate wiring 118, the first source electrode 119, the video signal wiring 12, the second gate wiring 121, the second source wiring 122 and the second shield wiring 123 are formed in the corresponding through holes.

Hydrofluoric acid (HF) is used to eliminate the oxide at the surface of the polysilicon semiconductor 103 in the through holes 172 and 174; in the structure of FIG. 9, however, in the through holes 130 and 131, the hydrofluoric acid (HF) contacts only the drain electrode 110 and the source electrode 111, but does not contact the oxide semiconductor film 109; thus, the oxide semiconductor film 109 is not dissolved in the hydrofluoric acid (HF). In addition, since the drain electrode 110 and the source electrode 111 are formed on the second gate insulating film 112, the oxide semiconductor film 109 is not contaminated in the process to form the drain electrode 110 and the source electrode 111. Thus, the oxide semiconductor TFT having stable characteristics can be realized.

As described above, the oxide semiconductor TFT of stable characteristics can be realized in the structure of embodiment 1. Further, the liquid crystal display device having hybrid structure, which includes the polysilicon semiconductor TFTs and the oxide semiconductor TFTs of stable characteristics, can be realized.

Embodiment 2

Figure 10:
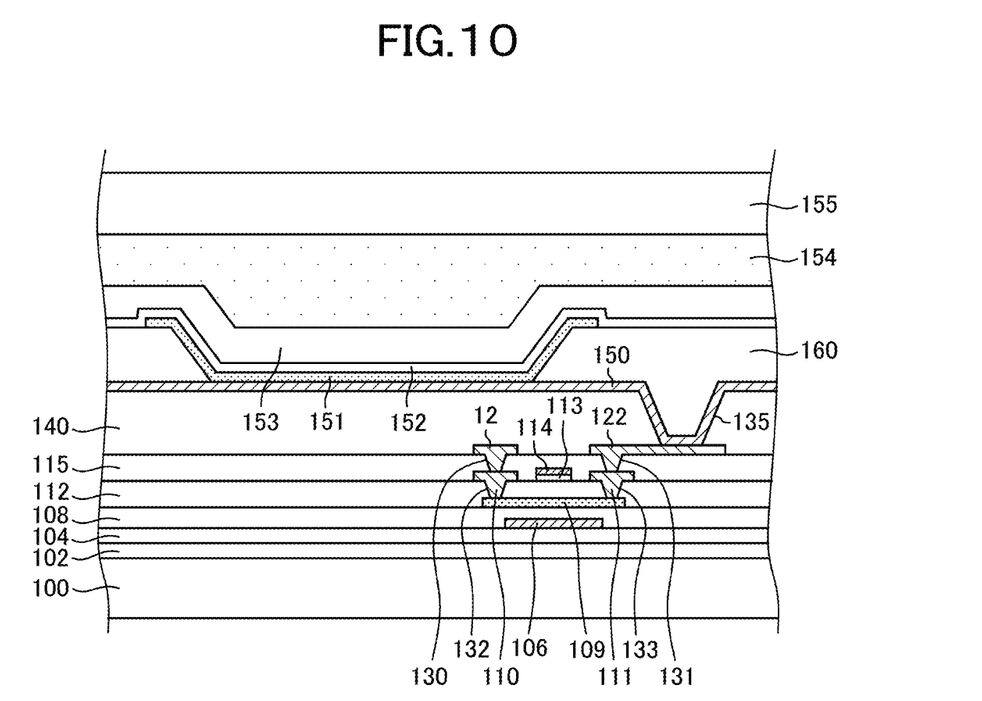
FIG. 10 is a cross sectional view of the display area of the organic EL display device.

In FIG. 1, the present invention is explained when it is applied to the liquid crystal display device. The present invention can be applied to the organic EL display device, too. FIG. 10 is a cross sectional view of the display area of the organic EL display device. The structure of FIG. 10 is the same as the structure of FIG. 2 of the liquid crystal display device up to forming the organic passivation film 140 covering the oxide semiconductor film 109; and forming the through hole 135 in the organic passivation film 140 to connect the TFT and the lower electrode 150.

In FIG. 10, the lower electrode 150, which works as an anode, is formed on the organic passivation film 140. The bank 160 having a hole is formed on the lower electrode 150. The organic EL layer 151 as an emitting layer is formed in the hole in the bank 160. The upper electrode 152, which works as a cathode, is formed on the organic EL layer 151. The upper electrode 152 is formed in common to plural pixels. The protecting film 153, which includes e.g. silicon nitride film, is formed covering the upper electrode 152. The circular polarized plate 155, which prevents a reflection of external light, is adhered to the protecting film 153 through the adhesive 154.

As shown in FIG. 10, the structure of the organic EL display device is the same up to forming the drain electrode 110 and the source electrode 111 for the oxide semiconductor TFT. Further, the structure of the peripheral driving circuit, which includes the polysilicon semiconductor TFTs, can have the same structure as explained in embodiment 1. Therefore, the present invention can be applied to the organic EL display device, too.

Embodiment 3

The hybrid structure, which the oxide semiconductor TFTs and the polysilicon semiconductor TFTs are formed on the same substrate, can be applied to the semiconductor devices as e.g. sensor devices as well as display devices. For example, the polysilicon semiconductor TFTs are used in the driving circuit for the sensor; the oxide semiconductor TFTs are used in the sensor elements in the detective area.

Figure 11:
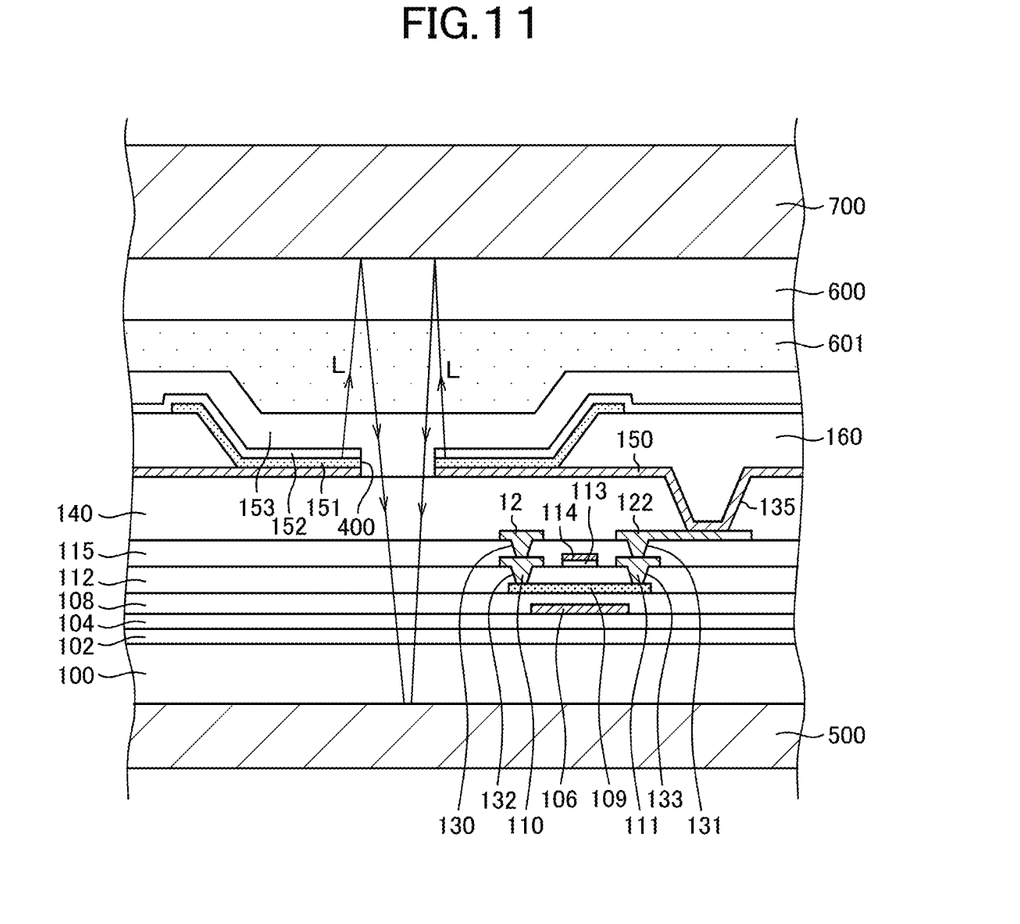
FIG. 11 is a cross sectional view of the optical sensor.

There are many kinds of sensors. The structure of FIG. 11 is an example that the similar structure to the organic EL display device is used as a light emitting element. In FIG. 11, the light receiving element 500 is set at the rear surface of the TFT substrate 100 of the light emitting element, which has the same structure as the display area of the organic EL display device explained at FIG. 10. The face plate 600, which is formed by the transparent glass substrate or the transparent resin substrate, is set at the upper surface of the light emitting element via the adhesive 601. The object to be measured 700 is set on the face plate 600.

In the light emitting element, the organic EL layer 151, the lower electrode 150 and the upper electrode 152 constitute the light emitting area. The window 400 is formed at the center of the light emitting element where the organic EL layer 151, the lower electrode 150 and the upper electrode 152 do not exist; consequently, the light can go through the window 400. In the meantime, since a reflective electrode is formed under the lower electrode 150, the light, emitted from the organic EL layer, goes to upper direction.

In FIG. 11, the light, emitted from the organic EL layer 151, reflects at the object 700, goes through the window 400, and is received by the light receiving element 500, which is set at the rear side of the TFT substrate 100; thus, the object 700 is detected. If there is no object to be measured, the reflected light does not exist; consequently, photo current is not generated in the light receiving element 500. Thus, the structure of FIG. 11 can detect the existence of the object 700.

Figure 12:
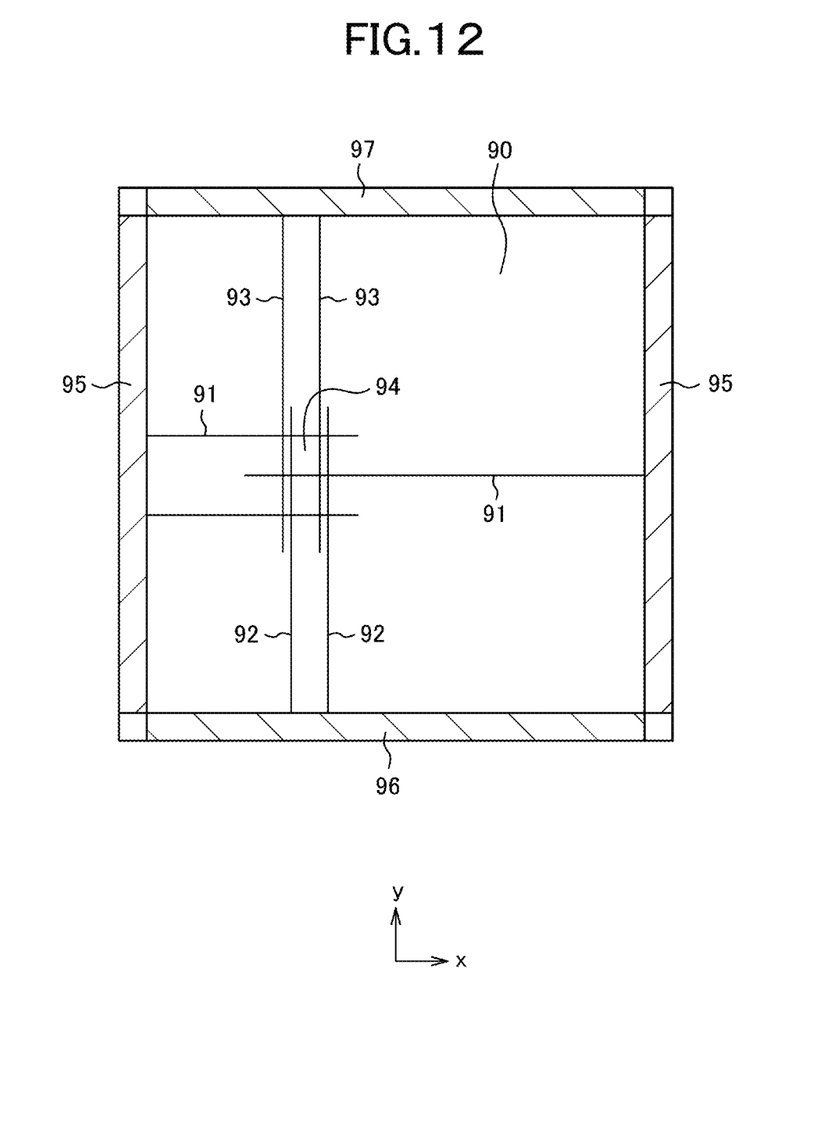
FIG. 12 is a plan view of the optical sensor.

FIG. 12 is a plan view of the optical sensor where the sensor elements shown in FIG. 11 are set in matrix arrangement. In FIG. 12, the scan signal wirings 91 extend in the horizontal direction (x direction or −x direction) from the scan signal driving circuits 95, which are set at the both sides. Signal wirings 92 extend in the upper direction (y direction) from the signal circuit 96, which is set at lower side; power lines 93 extend in the lower direction (−y direction) from the power circuit 97. The area surrounded by the scan signal wirings 91 and the signal lines 92 or the area surrounded by the scan signal wirings 91 and the power lines 93 is defined as the sensor element 94.

In FIG. 12, the polysilicon semiconductor TFTs can be used in the scan signal driving circuits 95 and the signal circuit 96; the oxide semiconductor TFTs can be used as the switching TFTs which are used in the sensor elements 94. Therefore, the hybrid structure, which is explained in embodiment 1, can be used in the optical sensor, too.

By the way, the optical sensor of embodiment 3 can detect two dimensional images by detecting intensities of the reflected light from the object 700 as well as detecting the existence of the object 700. In addition, by sensing colors, color images or spectral images can be detected. Definition of the sensor is determined by a size of the sensor element 94 in FIG. 12; however, the effective size of sensor element can be adjusted by combining plural sensor elements 94.

In the example of FIG. 11 and FIG. 12, the similar structure as the organic EL display device is applied to the optical sensor; however, the present invention is applicable to other optical sensors of different measuring method. Further, the present invention is applicable to other sensors having semiconductor circuit substrate, as e.g. a capacitance sensor as well as an optical sensor.

In the above embodiments, the present invention is explained for the structure that the oxide semiconductor TFTs and the polysilicon semiconductor TFTs are formed on the same substrate. The present invention, however, can be applied to the semiconductor device where either ones of the oxide semiconductor TFTs or the polysilicon semiconductor TFTs are formed on the substrate. Namely, the present invention is described as below: when the drain electrode and source electrode are formed in the oxide semiconductor TFT, the drain electrode and source electrode are not formed on the oxide semiconductor film but formed on the gate insulating film; then the drain wring (video signal wiring) and the source wiring are formed on the insulating film that covers the drain electrode and the source electrode; consequently, the oxide semiconductor is not contaminated in the process forming the drain electrode and the source electrode, and thus, the oxide semiconductor TFTs of stable characteristics are realized. The similar structure is applicable to the polysilicon TFT, too.

What is claimed is:

1. A semiconductor device including a substrate having a first TFT (thin film transistor) and a second TFT, wherein
the first TFT has a first semiconductor layer comprising oxide semiconductor, a first gate insulating film, a first gate electrode, a first drain electrode and a first source electrode,
a passivation film is formed covering the first gate electrode,
the second TFT has a second semiconductor layer, a second gate insulating film, a second gate electrode, a second drain electrode and a second source electrode,
an interlayer insulating film is arranged between the first semiconductor layer and the second semiconductor layer,
the first semiconductor layer is disposed in an upper layer than the second semiconductor layer,
the first drain electrode is connected to the first semiconductor layer via a first through hole formed in the first gate insulating film,
the first source electrode is connected to the first semiconductor layer via a second through hole formed in the first gate insulating film,
a gate wiring is extended in a first direction, a signal wiring is extended in a second direction crossing the first direction,
the first semiconductor layer has a bent portion and is arranged to intersect the gate wiring, in a plan view,
the signal wiring is formed on the passivation film,
the signal wiring connects to the first drain electrode via a third through hole formed in the passivation film, and
a light shading film is arranged below the first semiconductor layer and overlaps the first semiconductor layer in plan view.

2. The semiconductor device according to claim 1, wherein
the second semiconductor layer is a polysilicon semiconductor layer.

3. The semiconductor device according to claim 1, wherein
the second drain electrode and the second source electrode are formed on the passivation film,
a fifth through hole is formed through the first gate insulating film, the interlayer insulating film, the second gate insulating film and the passivation film,
the second drain electrode is connected to the second semiconductor layer via a fifth through hole,
a sixth through hole is formed through the first gate insulating film, the interlayer insulating film, the second gate insulating film and the passivation film, and
the second source electrode is connected to the second semiconductor layer via a sixth through hole.

4. The semiconductor device according to claim 1, wherein
the first through hole and the third through hole are set in different places and overlap the drain wiring in a plan view.

5. The semiconductor device according to claim 1, wherein
a source wiring connects to the first source electrode via a fourth through hole formed in the passivation film, and
the source wiring connects with a pixel electrode.

* * * * *